US007647029B2

(12) United States Patent
Kuhwald et al.

(10) Patent No.: US 7,647,029 B2
(45) Date of Patent: Jan. 12, 2010

(54) CONTROLLER-ASSISTED METHOD AND CONTROLLER-ASSISTED DEVICE FOR DETERMINING A CHARACTERISTIC OF A COMPENSATION MEMBER IN A LEVEL CONTROL CIRCUIT

(75) Inventors: Thomas Kuhwald, Dietramszell (DE); Werner Held, Pocking (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 145 days.

(21) Appl. No.: 11/659,384

(22) PCT Filed: Jun. 29, 2005

(86) PCT No.: PCT/EP2005/007001

§ 371 (c)(1), (2), (4) Date: Feb. 26, 2008

(87) PCT Pub. No.: WO2006/015663

PCT Pub. Date: Feb. 16, 2006

(65) Prior Publication Data

US 2008/0315947 A1 Dec. 25, 2008

(30) Foreign Application Priority Data

Aug. 5, 2004 (DE) ....................... 10 2004 038 089

(51) Int. Cl.
*H04B 1/04* (2006.01)

(52) U.S. Cl. ................. 455/126; 455/67.13; 455/240.1; 375/345; 330/136

(58) Field of Classification Search .............. 455/67.13, 455/114.2, 114.3, 126, 209, 230, 232.1, 240.1, 455/250.1; 375/345, 346; 330/136, 149
See application file for complete search history.

(56) References Cited

U.S. PATENT DOCUMENTS 5,194,823 A 3/1993 Wendt et al.

(Continued)

FOREIGN PATENT DOCUMENTS

DE 26 332 00 A 1/1978

(Continued)

OTHER PUBLICATIONS

International Search Report for PCT/EP2005/007001; mailed Oct. 12, 2005 (English and German).

(Continued)

*Primary Examiner*—Nhan T Le
(74) *Attorney, Agent, or Firm*—Marshall, Gerstein & Borun LLP

(57) ABSTRACT

In a controller-assisted device for determining a characteristic of a compensation element in a level control circuit, the compensation element is serially mounted inside the level control circuit for a high-frequency signal (S<SB>HF</SB>) in a signal channel with respect to said signal channel. The characteristic of the compensation element has a characteristic which the inverse of the non-linear transmission characteristic of the signal channel in the event of ideal compensation. In the controller-assisted method for the determination of a characteristic of the compensation element in a level control circuit, each ordinate value of the characteristic of the compensation element arises, in the event of a bridged compensation element, from the corrective signal value ($P_{astel}$) which is adjusted at a signal level of the level reference signal ($P_{ref}$) in the adjusted level control circuit, corresponding to the associated abscissa value of the characteristic of the compensation element.

20 Claims, 6 Drawing Sheets

U.S. PATENT DOCUMENTS

| | | | | |
|---|---|---|---|---|
| 5,697,073 | A | 12/1997 | Daniel et al. | |
| 6,552,609 | B2 * | 4/2003 | Hamada et al. | 330/149 |
| 6,621,340 | B1 * | 9/2003 | Perthold et al. | 330/149 |
| 6,741,867 | B1 * | 5/2004 | Tetsuya | 455/522 |
| 6,836,646 | B2 * | 12/2004 | Nagasaka | 455/126 |
| 6,982,965 | B2 * | 1/2006 | Itahara et al. | 370/317 |
| 2004/0198259 | A1 * | 10/2004 | Kim et al. | 455/114.1 |

FOREIGN PATENT DOCUMENTS

| | | | |
|---|---|---|---|
| DE | 36 102 52 | A | 10/1987 |
| DE | 36 36 865 | A1 | 12/1987 |
| DE | 19 524 037 | A1 | 1/1997 |
| EP | 0 451 277 | B1 | 6/1995 |

OTHER PUBLICATIONS

International Preliminary Report On Patentability for PCT/EP2005/007001; completed May 17, 2006 (English and German).

* cited by examiner

CONTROLLER-ASSISTED METHOD AND CONTROLLER-ASSISTED DEVICE FOR DETERMINING A CHARACTERISTIC OF A COMPENSATION MEMBER IN A LEVEL CONTROL CIRCUIT

BACKGROUND OF THE INVENTION

1. Field of the Invention

The invention relates to a controller-assisted method and a controller-assisted device for determining the characteristic of a compensation element in a level-control circuit.

2. Related Technology

According to the prior art, the signal level of high-frequency signals, for example, in transmitter output modules, receiver input modules or signal generators, is compensated to an adjustable level-reference value in automatic-gain control (AGC) circuits. EP 0 451 277 B1 discloses an automatic level-control circuit of this kind in a receiver input module. In this context, the amplification and/or attenuation factor of an amplification and/or attenuation element integrated in the signal channel is automatically adjusted via an adjustment signal, which is generated in a controller unit on the basis of the control difference between the level-reference value and the signal level of the high-frequency signal registered via a detector unit at the output of the signal channel.

Non-linearities in the signal channel, for example, in the amplification and/or attenuation element, cause instability in the level-control circuit and impair the dynamics of the level-control circuit.

In the case of DE 36 36 865 A1, an exact inverse adjustment of the transmission characteristic of the attenuation element to the transmission characteristic of the transmitter output module is implemented offline within the framework of an adjustment or calibration procedure by parameterization of the attenuation factor for all level values of the high-frequency signal. Since the course of the transmission characteristic of the transmission output module and, corresponding to this, of the transmission characteristic of the attenuation element, is dependent upon a series of parameters—such as the frequency of the high-frequency signal and the ambient t emperature—a plurality of characteristic courses must be determined for the attenuation element. Once again, within the framework of individual calibration procedures, a plurality of characteristic value pairs must be determined for each individual characteristic. This increases the adjustment cost to a considerable extent before the use of the transmitter, receiver or signal generator.

GENERAL DESCRIPTION OF THE INVENTION

The invention significantly reduces the cost of adjustment or calibration in determining the transmission characteristics of a compensation or attenuation element within a level-control circuit.

The invention provides a controller-assisted method for determining the characteristic of a compensation element and a controller-assisted device for determining the characteristic of a compensation element.

According to the invention, a method of determining characteristic value pairs of a compensation element in a level-control circuit includes the steps of:

connecting a compensation element in series with a signal channel that provides a high-frequency signal to a level control circuit, wherein the signal channel produces a non-linear transmission characteristic;

bridging a compensation element that, in the event of an ideal compensation, provides a characteristic inverse to the non-linear transmission characteristic of the signal channel; and generating a characteristic value pair using the bridged compensation element, wherein an abscissa value of the pair indicates a level of the level-reference signal and an ordinate value of the pair indicates a value of an adjustment signal generated from the level of the level-reference signal.

The invention also provides a device for determining the characteristic of a compensation element including:

a signal channel that provides a non-linear transmission characteristic;

a level-control circuit that operates on a high-frequency signal of the signal channel, the level-control circuit including a controller for forming an adjustment signal dependent upon a control difference between a signal level of a level-reference signal and an actual-level value of the high-frequency signal;

a compensation element that, in the event of an ideal compensation, provides a characteristic inverse to the non-linear transmission characteristic of the signal channel and generates a non-linear distorted adjustment signal;

an adjustment element-integrated in the signal channel with an amplification factor that is adjustable based on the non-linear distorted adjustment signal wherein the compensation element is adapted to be bridged and further adapted to determine each characteristic value pair, including an ordinate and abscissa value, of the characteristic of the compensation element.

Determining the individual characteristic value pairs of the compensation element, exploits the property of the level-control circuit that, with a bridged compensation element and with a signal level of the level-reference signal at the magnitude of the abscissa value of the characteristic of the compensation element in the compensated level-control circuit, a value occurs as the adjustment signal, which corresponds to the associated ordinate value of the characteristic of the compensation element with an ideal compensation of the transmission characteristic in the signal channel.

With a fixed frequency of the high-frequency signal at the input of the signal channel and by variation of the signal level of the level-reference signal in the compensated condition of the level-control circuit, it is therefore possible to register at the adjustment-signal terminal the ordinate values of the characteristic of the compensation element associated with the abscissa values present at the level-reference terminal, and accordingly to determine the characteristic of the compensation-element characteristic for a given frequency of the high-frequency signal in a comparatively low-cost manner. In the same manner, all the characteristics of the compensation element associated with the respective frequencies of the high-frequency signal can be determined by varying the frequency of the high-frequency signal within a given frequency raster.

By comparison with the adjustment and/or calibration methods of the prior art, no high-cost adjustment procedures are required for defined adjustment signals, no high-cost measurement procedures are required for determining the corresponding high-frequency signals at the output of the signal channel and, building upon this, comprehensive mathematical calculation procedures are not required for determining the characteristic value pairs for the individual characteristics of the compensation element. On the contrary, with the method according to the invention and with the device according to the invention, the adjustment of the individual abscissa values at the level-reference terminal and of the individual frequencies at the signal source of the high-frequency signal and the reading out of the ordinate values at the adjustment-signal terminal of the level-control circuit can be automated. Without high-cost mathematical calculations, the ordinate values of the frequency-dependent characteristics of the compensation element associated with the individual abscissa values can be written to the individual memory cells of the digitally-realized compensation element directly after reading out.

The temperature dependence of the transmission characteristic of the signal channel, which is only associated with a vertical displacement of the transmission characteristic, is determined in an exactly analogous manner by measuring the adjustment-signal change of the level-control circuit at a given ambient temperature relative to a reference ambient temperature with a fixed frequency of the high-frequency signal and a fixed signal level of the level-reference signal. By variation of the ambient temperature relative to a reference ambient temperature, the respective adjustment-signal change and/or the change in the respective actual level value of the high-frequency signal can be determined for use as a compensation signal in a unit for temperature compensation.

Since the temperature dependence of the transmission characteristic of the signal channel provides both a linear dependence—caused by the adjustment element of the signal channel—and also a logarithmic dependence—caused by the isolation amplifier of the signal channel, the corresponding temperature-dependent adjustment-signal changes must be measured for this purpose in separate measurement sequences in the case of a linear dependence; and the temperature-dependent changes of the actual level value of the high-frequency signal must be measured in separate measurement sequences in the case of a logarithmic dependence. In the case of a logarithmic dependence, the correspondingly-determined compensation values should be stored with the level reference signal in a first unit for temperature compensation for additive superimposition. In the case of a logarithmic dependence, the correspondingly-determined compensation values should be stored with the adjustment signal in a third unit for temperature compensation for additive superimposition. Finally, compensation values for compensating temperature-determined changes in the amplification factor of the measurement amplifier should be stored with the adjustment signal in a second unit for temperature compensation for additive superimposition.

BRIEF DESCRIPTION OF THE DRAWINGS

An exemplary embodiment of exemplifying the controller-assisted method and the controller-assisted device for determining the characteristic of the compensation element in a level-control circuit is explained in greater detail below with reference to the drawings. The drawings are as follows.

DETAILED DESCRIPTION

Figure 1:
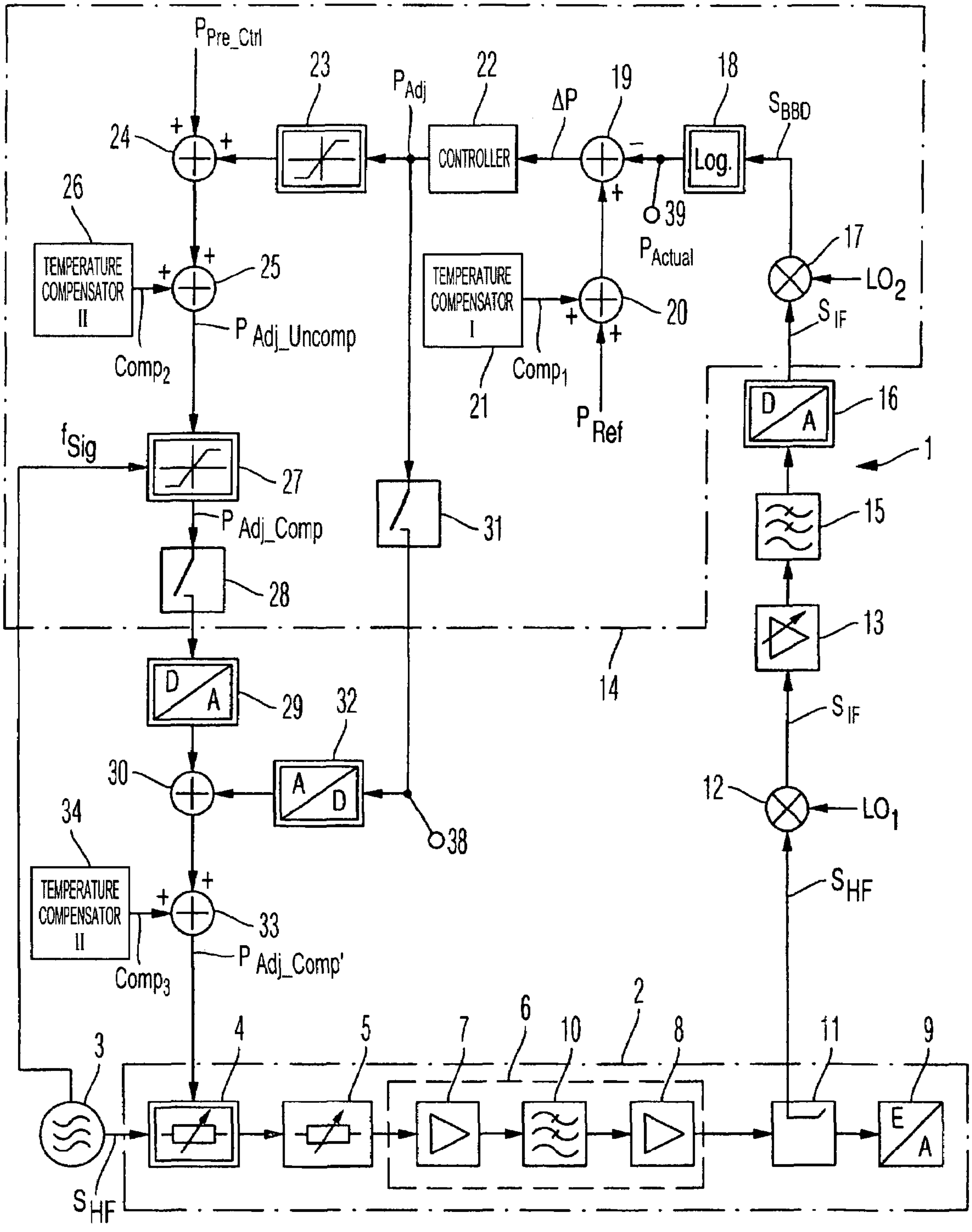
FIG. 1 shows a block circuit diagram of the controller-assisted device according to the invention for determining the characteristic of a compensation element in a level-control circuit.

The device according to the invention for determining the characteristic of a compensation element in a level-control circuit is used in a signal generator as shown in FIG. 1. Alternatively, the device according to the invention can also be used in other high-frequency technical equipment and systems, for example, in transmitter output modules or in receiver input modules, in which the level of a high-frequency signal is automatically adjusted with a level-control circuit.

The level-control circuit 1 includes a signal channel 2, in which a high-frequency signal, which is generated by a signal source 3, is guided and subjected to various message-processing functions. The frequency $f_{Sig}$ of the high-frequency signal $S_{HF}$ is adjusted in the signal source 3. The signal level of the high-frequency signal $S_{HF}$ is adjusted in an adjustment element 4 of the signal channel 2 adjacent to the signal source 3. For this purpose, the adjustment element 4 is controlled by a compensated adjustment signal $P_{adjusted\_compensated}$ proportional to the level re-adjustment of the high-frequency signal $S_{HF}$.

The high-frequency signal $S_{HF}$ re-adjusted with regard to its signal level in the adjustment element 4 is then supplied via a calibration line 5 with defined impedance values to an isolation amplifier 6. In the isolation amplifier 6, a galvanic decoupling is implemented via two amplification stages 7 and 8 between the signal source of the signal generator and the input/output module 9 of the signal channel 2 of the signal generator. Between the two amplifier stages 7 and 8, the isolation amplifier 6 additionally contains a low-pass filter 10 for the attenuation of injected higher-frequency interference signals. A detection device 11, which is designed as a directional coupler in the signal generator shown in FIG. 1, is connected between the isolation amplifier 6 and the input/output module 9. For the measurement, the high-frequency signal $S_{HF}$ is registered and decoupled in the directional coupler 11 at the end of the signal channel 2.

The decoupled high-frequency signal $S_{HF}$ is mixed down in the adjacent down mixer 12 by means of the mixer signal $LO_1$ into the intermediate-frequency signal $S_{IF}$. The adjacent measurement amplifier 13, which provides a controllable amplification factor, implements an adaptation of the level of the intermediate-frequency signal $S_{IF}$ to the predominant level of the digital signal processing range 14 of the level-control circuit 1. The adjacent antialiasing low-pass filter 15 suppresses the generation of higher-transient spectral components caused by the adjacent analog/digital conversion.

The analog/digital conversion in the analog/digital converter 16 leads to the digitized intermediate-frequency signal $S_{IFD}$, which is transferred in the adjacent down mixer 17 by means of the mixer signal $LO_2$ into the corresponding digitized baseband signal $S_{BBD}$. The digitized baseband signal $S_{BBD}$ is logged in the log unit 18 to form the logarithmic actual-level value $P_{Actual}$ so that it is present in the same scale as the logged level-reference signal $P_{Ref}$ thereby allowing a meaningful formation of the control difference in the adjacent control-difference-forming unit 19.

A compensation signal $Comp_1$ is additively superimposed over the logarithmic level-reference signal $P_{Ref}$ upstream of the control-difference forming unit in a summation element 20. This compensation signal $Comp_1$ is generated in a first temperature-compensation unit 21. The compensation signal $Comp_1$ is used to compensate the temperature-determined logarithmic displacements of the transmission characteristic of the signal channel 2, which occur focally in the isolation amplifier 6.

The control-difference signal ΔP from the control-difference forming unit 19 is supplied to the digitally-realized controller 22, which provides, for example, a proportionally-integrating control dynamic realized in the form of a digital filter. The adjustment signal $P_{Adj}$ generated by the controller 22 is subjected to an adjustment-signal limitation in a signal limiter 23. An additional additive injection of a pre-control signal $P_{Pre\_ctrl}$ to the limited adjustment signal $P_{Adj}$ of the controller 22 is implemented in a further summation element 24. This pre-control signal $P_{Pre\_ctrl}$ is not absolutely essential, but significantly accelerates the transient process of the level-control circuit 1. The pre-control signal $P_{Pre\_ctrl}$, which is determined dependent upon the signal value of the level-reference signal $P_{Ref}$, is connected directly to the adjustment element 4 without feedback and leads to a level adjustment of the high-frequency signal $S_{HF}$ in the proximity of the adjusted signal level of the level-reference signal $P_{Ref}$. The pre-control signal $P_{Pre\_ctrl}$ therefore has the transient dynamic of the pre-control branch of the level-control circuit 1 reduced by comparison with a closed control circuit.

Accordingly, the controller 22 now still only controls the residual control-difference ΔP between the adjusted signal level of the level-reference signal $P_{Ref}$ and the actual level value $P_{Actual}$ of the high-frequency signal $S_{HF}$ achieved by the pre-control signal $P_{Pre\_ctrl}$, which are caused, for example, by superimposed interference signals or by parameter fluctuations in the functional units of the pre-control branch of the level-control circuit 1.

An additional additive injection of an additional compensation signal $Comp_2$ to the summation signal derived from the pre-control signal $P_{Pre\_ctrl}$ and the limited adjustment signal $P_{Adj}$ of the controller 22 is implemented in the subsequent summation element 25. This compensation signal $Comp_2$ is generated in a second temperature-compensation unit 26. The temperature-compensation signal $Comp_2$ is used to compensate temperature-determined changes of the amplification factor of the measurement amplifier 13.

In the adjacent compensation element 27, of which the non-linear characteristic in the event of an ideal compensation is exactly inverse to the non-linear transmission characteristic of the signal channel 2, the un-compensated summation adjustment signal $P_{Adj\_Uncomp}$ at the input of the compensation element 27, formed from the pre-control signal $P_{Pre\_ctrl}$, the amplitude-limited adjustment signal $P_{Adj}$ of the controller 22 and the compensation signal $Comp_2$, is distorted in a nonlinear manner, which leads to a non-linear-distorted summation-adjustment signal $P_{Adj\_Comp}$ compensated by the compensation element 27 at the output of the compensation element 27. Since the transmission characteristic of the signal channel 2 is dependent upon the frequency $f_{Sig}$ of the high-frequency signal $S_{HF}$, the compensation element 27 also provides corresponding inverse, non-linear characteristics dependent upon the respective frequency $f_{Sig}$. The correct characteristic dependent upon the frequency $f_{Sig}$ of the high-frequency signal $S_{HF}$ is selected in the compensation element 27 via the frequency signal $f_{Sig}$ of the high-frequency signal $S_{HF}$ present at the input of the compensation element 27.

The compensated summation-adjustment signal $P_{Adj\_Comp}$ at the output of the compensation element 27 is locked in the phase of the determination of the characteristic of the compensation element 27 with the downstream switch 28 for the further control of the adjustment element 4 open and conveyed forward in the phase of the normal level-control mode with the downstream switch 28 for the further control of the adjustment element 4 closed. In the adjacent digital/analog converter 29, the compensated summation-adjustment signal $P_{Adj\_Comp}$ is converted from the digital format of the digital signal-processing region 14 of the level-control circuit 1 into the analog format.

The adjustment signal $P_{Adj}$ generated by the controller 22 is conveyed forward in the phase of the determination of the characteristic of the compensation element 27 with the downstream switch 31 for the further control of the adjustment element 4 closed and locked in the phase of the normal level-control mode with downstream switch 31 for the further control of the adjustment element 4 open. The adjustment signal $P_{Adj}$ of the controller 22 conveyed forward via the closed switch 31 in the phase of the determination of the characteristic of the compensation element 27 is converted by the digital/analog converter 32 from the digital format of the digital signal-processing region 14 of the level-control circuit into the analog format. Dependent upon the operating phase, the summation element 30 connects either the compensated summation-adjustment signal $P_{Adj\_Comp}$ of the compensation element 27 or the adjustment signal $P_{Adj}$ of the controller 22 in order to control the adjustment element 4. As an alternative to the two switches 28 and 31 of the summation element 30 and the two digital/analog converters 29 and 32, a multiplexer and an adjacent digital/analog converter can also be used, wherein, dependent upon the operating phase, the multiplexer, connects either the compensated summation-adjustment signal $P_{Adj\_Comp}$ of the compensation element 27 or the adjustment signal $P_{Adj}$ of the controller 22 in order to control the adjustment element 4.

In a further summation element 33, an additive superimposition of an additional compensation signal $Comp_3$ on the compensated summation-adjustment signal $P_{Adj\_Comp}$ is implemented in the phase of the normal level-control mode. This additional compensation signal $Comp_3$ is generated in a third temperature-compensation unit 34. The compensation signal $Comp_3$ is used for the compensation of temperature-determined, linear displacements of the transmission characteristic of the signal channel 2, which occur focally within the adjustment element 4. The compensated summation-adjustment signal $P_{Adj\_Comp}$ with the addition of the compensation signal $Comp_3$ is provided at the output of the summation element 34 and conveyed as a completely level-compensated summation-adjustment signal $P_{Adj\_Comp}$, to the adjustment signal 4 in order to re-adjust the signal level of the high-frequency signal $S_{HF}$.

Figure 2:
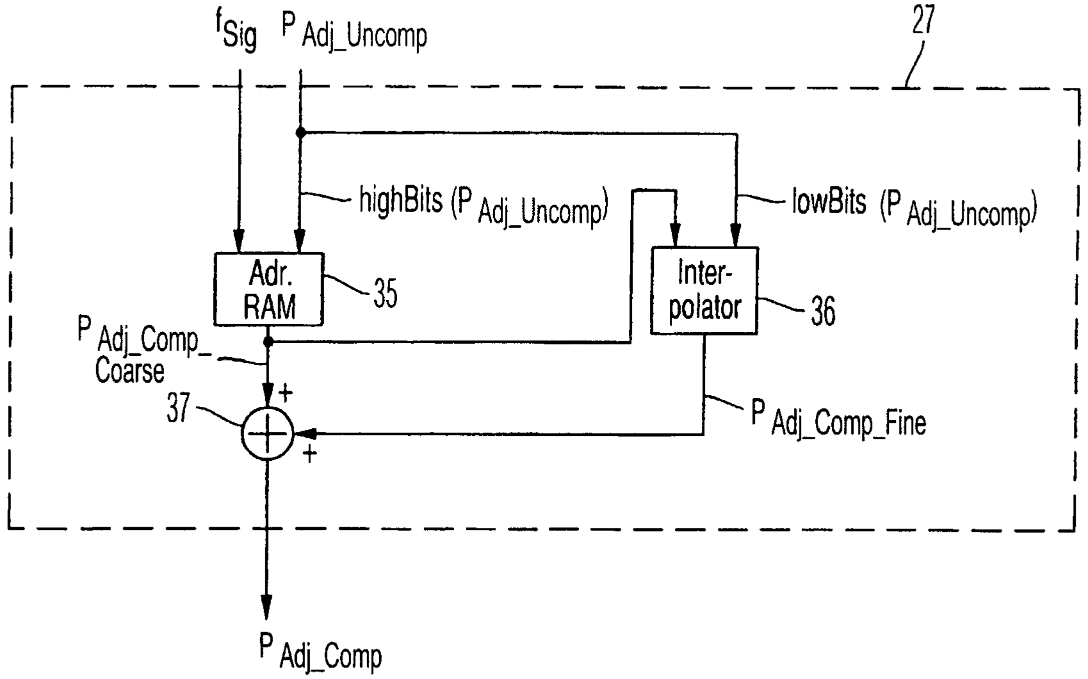
FIG. 2 shows a block circuit diagram of the compensation element in the controller-assisted device according to the invention for determining the characteristic of a compensation element in a level-control circuit.

The realization of the compensation element 27, which is designed in a digital manner, is presented in detail in FIG. 2. The ordinate values associated with the respective abscissa values of the non-linear characteristic are stored in the individual memory cells of a memory (RAM) 35. However, in this context, only the coarse ordinate values associated with a coarse raster of abscissa values of the non-linear characteristic are stored in this manner. The coarse-raster abscissa values of the non-linear characteristic correspond to the higher-value bits of the digitized, uncompensated adjustment signal highBits($P_{Adj\_Uncomp}$). The higher value bits of the digitized uncompensated adjustment signal $P_{Adj\_Uncomp}$ are used in order to address the associated coarse ordinate values of the non-linear characteristic. The frequency signal $f_{Sig}$ of the signal source 3 is used because of the frequency dependence of the characteristic. After addressing, the corresponding coarse ordinate value $P_{Adj\_Uncomp\_coarse}$ of the non-linear characteristic is provided at the output of the memory (RAM) 35.

Figure 3:
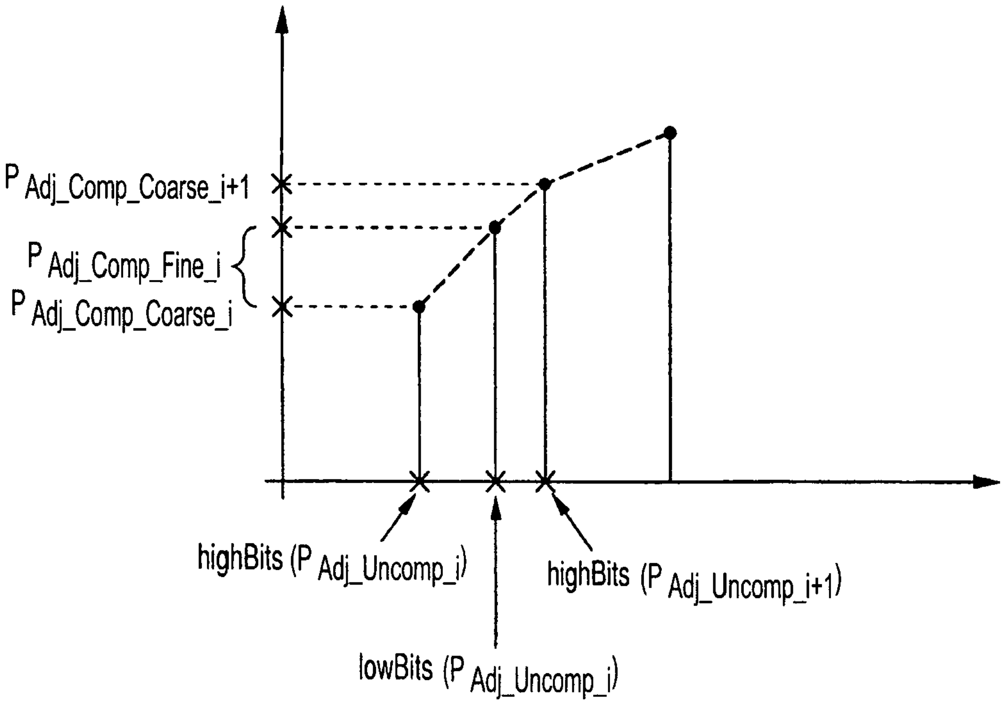
FIG. 3 shows a detail from the characteristic of the compensation element in the controller-assisted device according to the invention for determining the characteristic of a compensation element in a level-control circuit.

In addition to the coarse ordinate value $P_{Adj\_Uncomp\_coarse}$ of the nonlinear characteristic, an additional fine ordinate value $P_{Adj\_Comp\_fine}$ is generated in an interpolator 36. This fine ordinate value of the non-linear characteristic corresponds to the correction or incremental value at the coarse ordinate value with a finer rastering of the abscissa values of the non-linear characteristic. The finer rastering of the respective abscissa values of the non-linear characteristic is obtained from the lower-value bits of the digitized uncompensated adjustment signal lowBits($P_{Adj\_Uncomp}$). The fine ordinate value $P_{Adj\_Comp\_fine}$ is determined in the interpolator 36 by linear interpolation from the coarse ordinate value $P_{Adj\_Comp\_coarse\_i}$ disposed at the output of the memory 35 and the adjacent ordinate value $P_{Adj\_Comp\_coarse\_i+1}$ of the non-linear characteristic, the coarse-abscissa-value raster highBits($P_{Adj\_Uncomp\_i+1}$)−highBits($P_{Adj\_Uncomp\_i}$) and the fine abscissa value of the lower-value bits of the digitized un-compensated adjustment signal lowBits($P_{Adj\_Uncomp}$) as shown in equation (1) and the nomenclature of in FIG. 3.

$$P_{Adj\_Comp\_fine\_i} = \frac{lowBits(P_{Adj\_Uncomp\_i}) - highBits(P_{Adj\_Uncomp\_i})}{highBits(P_{Adj\_Uncomp\_i+1}) - highBits(P_{Adj\_Uncomp\_i})} * (P_{Adj\_Comp\_i+1} - P_{Adj\_Comp\_i}) + P_{Adj\_Comp\_coarse\_i}. \quad (1)$$

In the subsequent summation element 37, the coarse ordinate value $P_{Adj\_Comp\_coarse\_i}$ at the output of the memory 35 and the fine ordinate value $P_{Adj\_Comp\_fine\_i}$ at the output of the interpolator 36 are added to the exact ordinate value $P_{Adj\_Comp\_i}$ of the non-linear characteristic, which represents the compensated adjustment signal $P_{Adj\_Comp}$.

Figure 4:
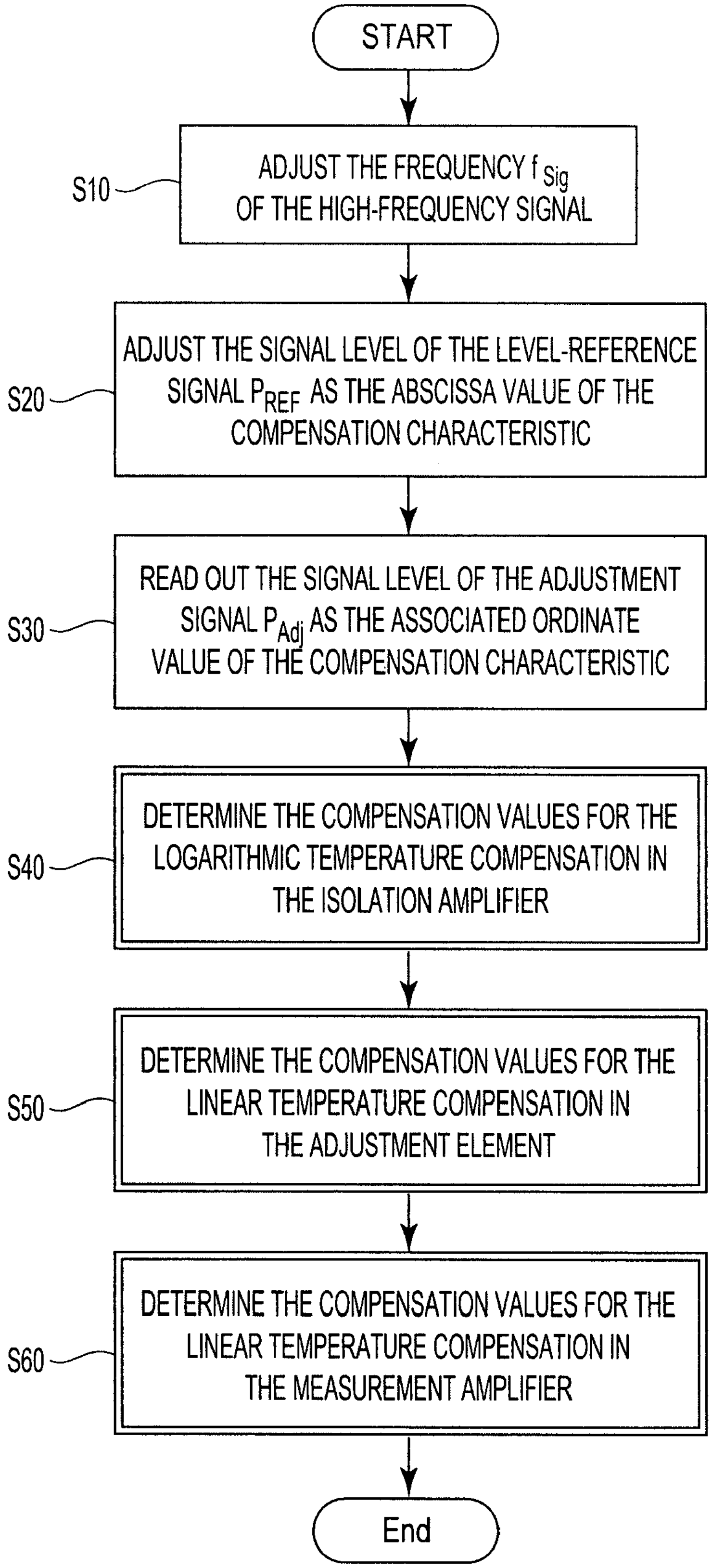
FIG. 4 shows a flow chart of the controller-assisted method according to the invention for determining the characteristic of a compensation element in a level-control circuit.

The flow chart in FIG. 4 shows the controller-assisted method according to the invention for determining the characteristic of a compensation element 27 in a level-control circuit 1.

In procedural stage S10, the frequency $f_{Sig}$ of the high-frequency signal $S_{HF}$ is adjusted at the signal source 3.

In the subsequent procedural stage S20, the signal level of the level-reference signal $P_{Ref}$ in the level-control circuit 1 is adjusted to correspond to the abscissa value of the respective characteristic value pair of the characteristic of the compensation element 27.

The switch 31 is closed, while the switch 28 is opened. The temperature compensation unit 34 is inactive at the current time, so that after switching on the controller 22 of the level-control circuit 1 and waiting for the transient procedure of the level-control circuit 1 at the control input of the adjustment element 4, the adjustment signal $P_{Adj}$ generated by the controller 22 and converted into an analog signal is present as a stationary signal. In procedural stage S30, the value of the adjustment signal $P_{Adj}$ of the controller 22 occurring as a stationary signal can be read out in a digital format before the digital input of the digital/analog converter 32 at the terminal point 38 as an ordinate value of the characteristic of the compensation element 27, and can be written as a coarse ordinate value $P_{Adj\_Comp\_coarse\_i}$ to the memory cell of the memory component 35 of the compensation element 27 addressed by the associated abscissa value, which corresponds to the adjusted signal level of the level-reference signal $P_{Ref}$.

Procedural stages S10, S20 and S30 are then implemented repetitively in order to determine all of the characteristic value pairs of the characteristic of the compensation element 27.

In procedural stage S40, after the determination of all characteristic value pairs of the characteristic of the compensation element 27 in the preceding procedural stages S10, S20 and S30, the compensation values $Comp_{1i}$ of the first compensation signal $Comp_1$ for the temperature compensation in the first temperature-compensation unit 21, which compensate a logarithmic temperature-determined displacement of the non-linear transmission characteristic of the signal channel 2 caused, in particular, by the isolation amplifier 6, are determined.

Figure 5:
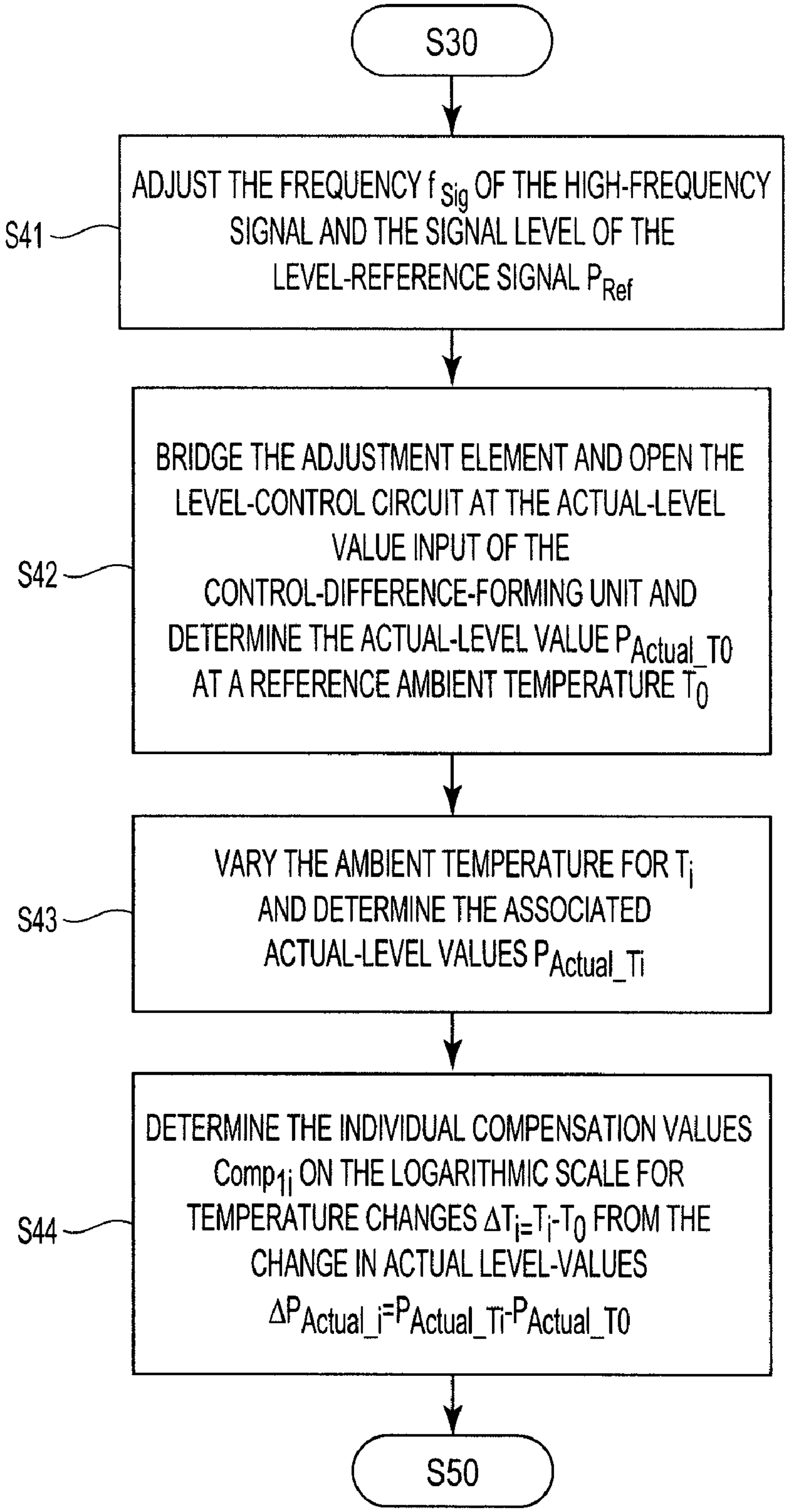
FIG. 5 shows a flow chart for determining the compensation values in the case of a temperature-dependent displacement of the isolation-amplifier transmission characteristic in the signal channel.

Procedural stage S40 for determining the compensation values $Comp_{1i}$ of the first compensation signal $Comp_1$ is subdivided into the sub-procedural stages S41 to S44 as shown in FIG. 5.

In the sub-procedural stage S41, the frequency $f_{Sig}$ of the high-frequency signal $S_{HF}$ is adjusted at the signal source 3, and a given signal level of the level-reference signal $P_{Ref}$ is specified at the level-reference input of the level-control circuit 1.

In sub-procedural stage S42, the adjustment element 4 is bridged in order to avoid the temperature-determined displacement of the transmission characteristic of the signal channel 2 on the linear scale, which is caused, in particular, by the adjustment element 4. Since the temperature-determined displacement of the transmission characteristic of the signal channel 2 is implemented on the logarithmic scale, a corresponding temperature compensation must also be implemented on the logarithmic scale and must accordingly be realized within the range of the control-difference formation of the level-control circuit 1 implemented on a logarithmic scale. For this reason, the level-control circuit 1 is open in the range of the actual level-value input of the control-difference-forming unit 19. In sub-procedural stage S42, the actual level value $P_{Actual\_T0}$ occurring at a reference ambient temperature $T_0$ and at a specified signal level of the level-reference signal $P_{Ref}$ is measured with a given reference ambient temperature $T_0$ at the terminal 39 of the level-control circuit 1 immediately before the open position of the level-control circuit 1 in the proximity of the actual level-value input of the control-difference forming unit 19.

In the subsequent sub-procedural stage S43, the ambient temperature $T_i$ is varied and, with the same signal level of the level-reference signal $P_{Ref}$, the actual level value $P_{Actual\_Ti}$ changing in a temperature-determined manner relative to the ambient temperature $T_i$ is measured.

Finally, in the last sub-procedural stage S44, the actual-level-value change $\Delta P_{Actual\_i} = P_{Actual\_Ti} - P_{Actual\_T0}$ determined by the temperature change between the ambient temperature $T_i$ and the reference ambient temperature $T_0$ is calculated from the previously-measured actual-level values $P_{Actual\_Ti}$ and $P_{Actual\_T0}$ and stored in the first temperature compensation unit 21 as a compensation value $Comp_{1i}$ of the first compensation signal $Comp_1$ with a temperature change from the reference ambient temperature $T_0$ the ambient temperature $T_i$.

The sub-procedural stages S43 and S44 are implemented in a given temperature raster for different ambient-temperature values $T_i$ in an analogous manner to the determination of corresponding compensation values $Comp_{1i}$ of the first compensation signal $Comp_1$.

In the next main procedural stage S50, the compensation values $Comp_{3i}$ of the third compensation signal $Comp_3$ for the compensation of the temperature-determined displacement of the transmission characteristic of the signal channel 2 on the linear scale, which is caused, in particular, by the temperature-determined displacement of the pinch-off voltage of the GaAs-field-effect transistors in the adjustment element 4, are determined.

Figure 6:
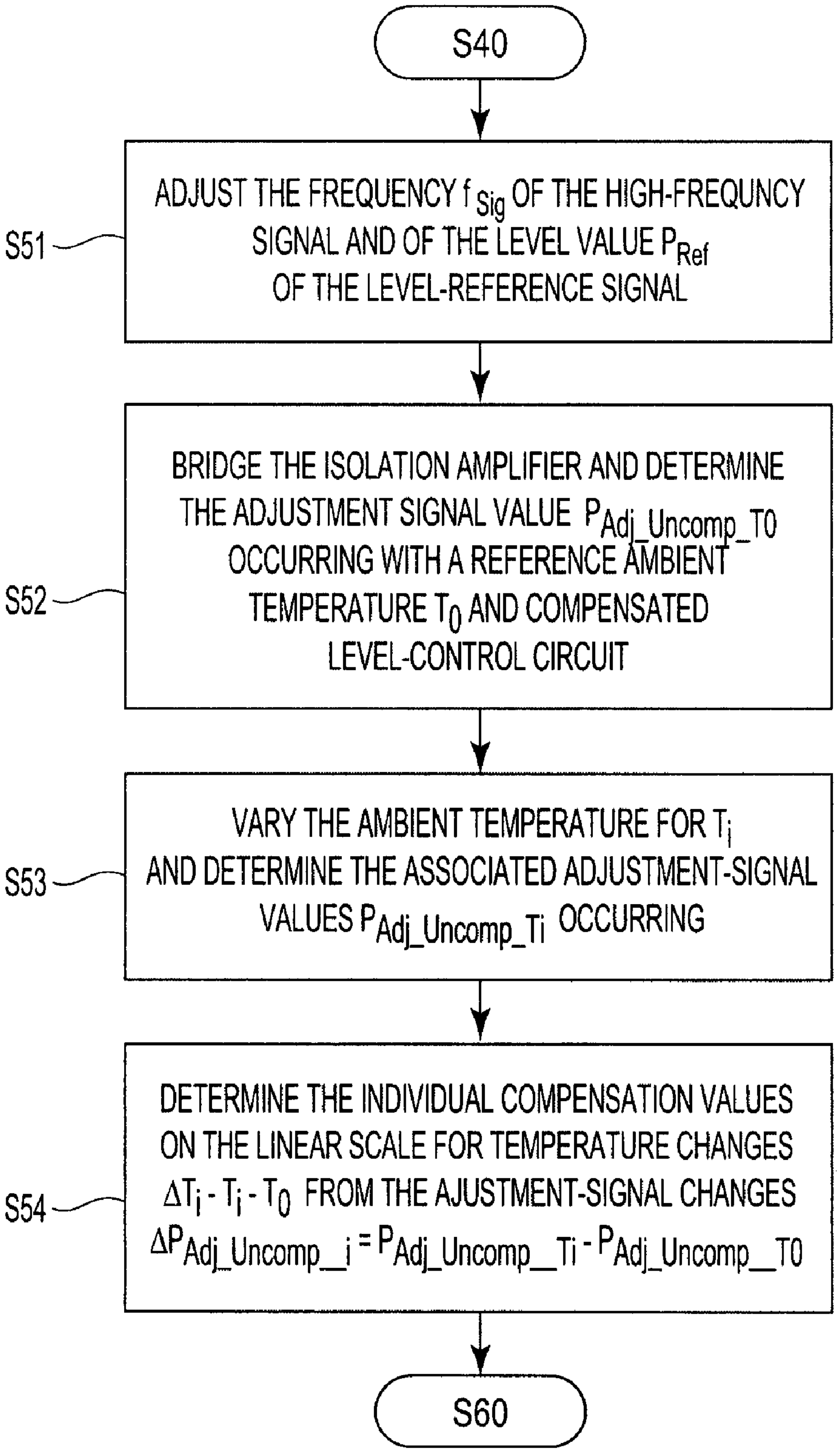
FIG. 6 shows a flow chart for determining the compensation values in the case of a temperature-determined displacement of the adjustment-element transmission characteristic in the signal channel and FIG. 7 shows a flow chart for determining the compensation values in the case of a temperature-dependent change of the amplification factor of the measurement amplifier in the level-control circuit.

The determination of the compensation values $Comp_{3i}$ of the third compensation signal $Comp_3$ of the main procedural stage S50 is broken down into the sub-procedural stages S51 to S54 as shown in FIG. 6. This takes place by analogy with the determination of the characteristic value pairs of the compensation element 27 in the procedural stages S10 to S30.

In sub-procedural stage S51, by analogy with sub-procedural stage S41 for a signal source 3, the frequency $f_{Sig}$ of the high-frequency signal $S_{HF}$ is adjusted, and a given signal level for the level-reference signal $P_{Ref}$ is applied to the level-reference input of the level-control circuit 1.

In determining the compensation values $Comp_{3i}$ of the third compensation signal $Comp_3$ in sub-procedural stage S52, the isolation amplifier 6 is bridged in order to avoid additional temperature-determined displacements of the non-linear transmission characteristic of the signal channel 2 on a logarithmic scale caused by the isolation amplifier 6. In sub-procedural stage S52, the adjustment signal value $P_{Adj\_Comp\_T0}$ occurring at the input of the adjustment element 4 is determined with a reference ambient temperature $T_0$ and a compensated level-control circuit.

In the next sub-procedural stage S53, the ambient temperature $T_i$ is varied and the new adjustment signal value $P_{Adj\_Comp\_Ti}$ occurring at the new ambient temperature $T_i$ as a result of the temperature-increase-determined displacement of the non-linear transmission characteristic of the signal channel 2 is measured.

In the final sub-procedural stage S54, the calculation of the compensation values $Comp_{3i}$ of the third compensation signal $Comp_3$ is implemented for a temperature compensation of the temperature-determined displacement of the transmission characteristic of the signal channel 2 on the linear scale with a temperature change $\Delta T_i = T_i - T_0$ by forming the adjustment-signal change $\Delta P_{Adj\_Comp\_i}$ as the difference between the adjustment signal value $P_{Adj\_Comp\_Ti}$ occurring at the ambient temperature $T_i$ and the adjustment signal value $P_{Adj\_Comp\_T0}$ occurring at the reference ambient temperature $T_0$ and entering this in the third temperature-compensation unit 34 as the compensation value $Comp_{3i}$ of the third compensation signal $Comp_3$ with a temperature increase $\Delta T_i$.

By analogy, the sub-procedural stages S53 and S54 are implemented within a given temperature raster for different ambient temperature values $T_i$, and the corresponding compensation values $Comp_{3i}$ of the third compensation signal $Comp_3$ are stored in the third temperature compensation unit 34.

Finally, it should be noted that the influence of the characteristic of the compensation element 27 on the adjustment-signal change $\Delta P_{Adj\_Comp\_i}$ and therefore on the compensation values $Comp_{3i}$ of the third compensation signal $Comp_3$ no longer occurs as a result of the difference formation, so that the determination of the individual adjustment signals $P_{Adj\_Comp\_Ti}$ occurring at the ambient temperatures $T_i$ can be implemented either with switch 28 closed or with switch 31 closed.

Figure 7:
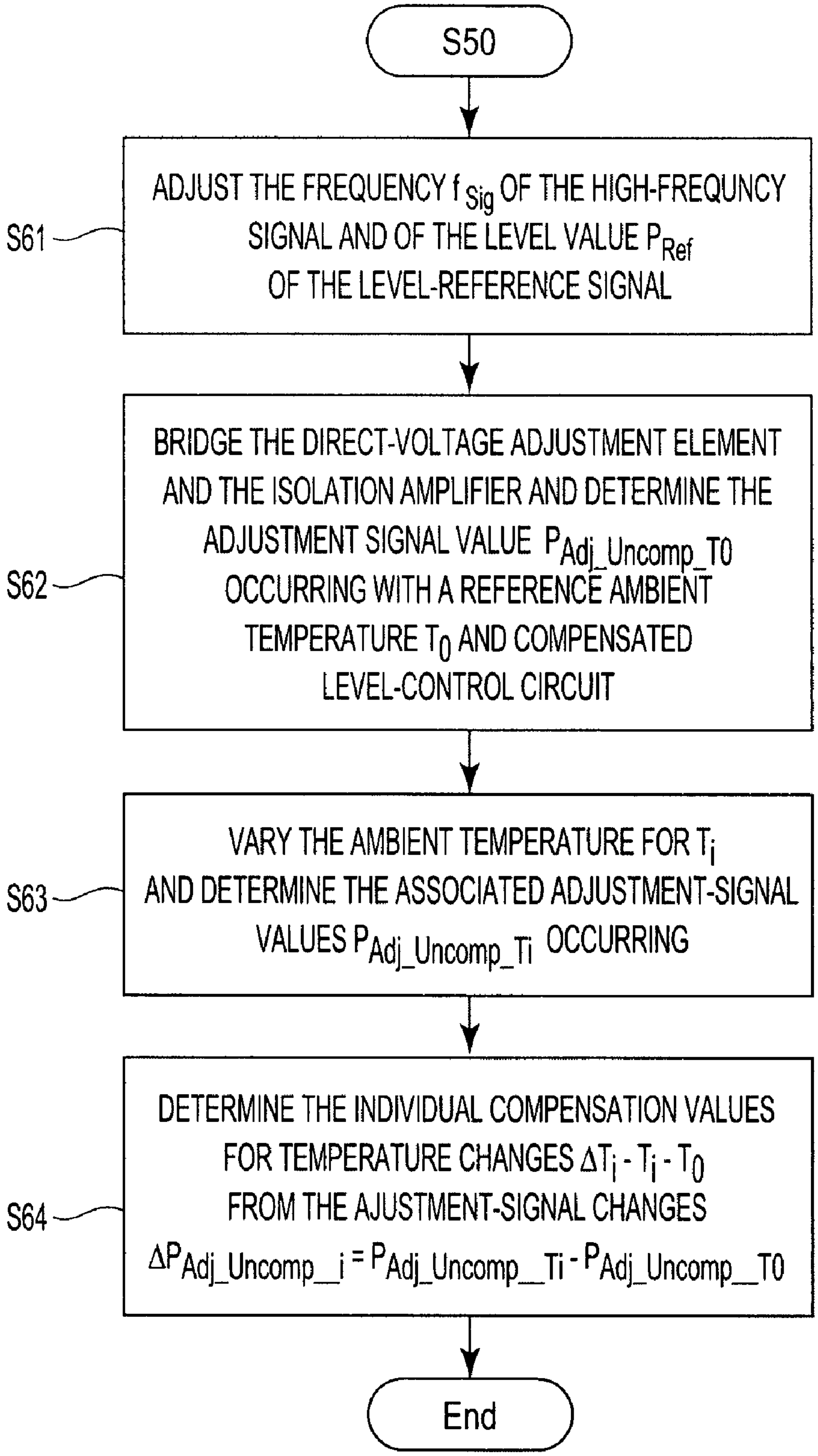

Finally, in the last main procedural stage S60, the compensation values $Comp_{2i}$ of the second compensation signal $Comp_2$ for the temperature compensation of the temperature-determined change of the transmission behavior, especially the amplification factor, of the measurement amplifier 13 are determined. For this purpose, the main procedural stage S60 is broken down into the sub-procedural stages S61 to S64 as shown in FIG. 7.

Sub-procedural stages S61 to S64 for determining the compensation values $Comp_{2i}$ of the second compensation signal $Comp_2$ for the temperature compensation of the temperature-determined change of the transmission behavior of the measurement amplifier 13 correspond to sub-procedural stages S51 to S54 for determining the compensation values $Comp_{3i}$ of the third compensation signal $Comp_3$ for the temperature compensation of the temperature-determined displacement of the transmission characteristic of the signal channel 2 on the linear scale. Accordingly, reference will be made only to the differences between the two main procedural stages S50 and S60.

In order to avoid additional temperature-determined changes of the transmission characteristic of the signal channel 2, which undesirably falsify the adjustment signal $P_{Adj\_Comp\_Ti}$ to be determined at the ambient temperatures $T_i$, the adjustment element 4 and the isolation amplifier 6 are bridged in sub-procedural stage S62.

By analogy with the main procedural stage S50, in order to determine the compensation values $Comp_{2i}$ of the second compensation signal $Comp_2$ for the temperature compensation of the temperature-determined change of the transmission behavior of the measurement amplifier 13, the characteristic of the compensation element 27 does not influence the adjustment-signal change $\Delta P_{Adj\_Comp\_i}$ and therefore the compensation values $Comp_{2i}$ of the second compensation signal $Comp_2$ as a result of the difference formation, so that either switch 28 or switch 31 can be closed for the determination of the adjustment signals $P_{Adj\_Comp\_Ti}$ occurring at the ambient temperature $T_i$.

The compensation values $Comp_{2i}$ of the second compensation signal $Comp_2$ for the temperature compensation of the temperature-determined change of the transmission behavior of the measurement amplifier 13 are stored in the second temperature-compensation unit 26.

The invention is not restricted to the embodiment presented. In particular, other regulation and control structures for forming the level-control circuit 1 and also for implementing the controller-assisted method and the controller-assisted device for determining the characteristic of the compensation element of a level-control circuit can be used and are covered by the invention. Finally, it should also be noted, that instead of the digital realization of the signal-processing region 14 of the level-control circuit 1, an analog realization of the invention is also covered.

The invention claimed is:

1. A method of determining characteristic value pairs of a compensation element in a level-control circuit comprising:

connecting a compensation element in series with a signal channel that provides a high-frequency signal to a level control circuit, wherein the signal channel produces a non-linear transmission characteristic;

bridging a compensation element that, in the event of an ideal compensation, provides a characteristic inverse to the non-linear transmission characteristic of the signal channel; and generating a characteristic value pair using the bridged compensation element, wherein an abscissa value of the pair indicates a level of the level-reference signal and an ordinate value of the pair indicates a value of an adjustment signal generated from the level of the level-reference signal.

2. The method of claim 1, wherein the non-linear characteristic of the signal channel is dependent upon a frequency of the high-frequency signal and upon an ambient temperature.

3. The method of claim 2, wherein generating each value pair is determined by adjusting the frequency of the high-frequency signal;

adjusting the signal level of the level-reference signal for the level-control circuit to correspond to the abscissa value for the value pair of the characteristic of the compensation element and determining the adjustment signal occurring as the associated ordinate value of the value pair for the characteristic of the compensation element in the compensated level-control circuit.

4. The method of claim 1, wherein a vertical displacement of the transmission characteristic of the signal channel is compensated on a linear scale for a defined ambient-temperature difference with reference to a reference ambient temperature by a third compensation signal, wherein the value of the third compensation signal is determined from an adjustment-signal difference that is dependent on an ambient-temperature difference, and wherein the third compensation signal is superimposed in an inverse, additive manner on the adjustment signal.

5. The method of claim 1, wherein a vertical displacement of the transmission characteristic of the signal channel is compensated on a logarithmic scale for a defined ambient-temperature difference with reference to a reference ambient temperature by a first compensation signal, wherein the value of the first compensation signal is determined from a logged difference in actual-level value of the high-frequency signal, the actual-level value difference being dependent on an ambient-temperature difference, and further wherein the first compensation signal is superimposed in an inverse, additive manner on the level-reference signal.

6. The method of claim 1, wherein a change in an amplification factor of a measurement amplifier is compensated for a defined ambient-temperature difference with reference to a reference ambient temperature by a second compensation signal, wherein the value of the second compensation signal is determined from an adjustment-signal difference that is dependent on an ambient-temperature difference, and further wherein the second compensation signal is superimposed in an inverse, additive manner on an un-compensated adjustment signal.

7. A device for determining the characteristic of a compensation element comprising:

a signal channel that provides a non-linear transmission characteristic;

a level-control circuit that operates on a high-frequency signal of the signal channel, the level-control circuit including a controller for forming an adjustment signal dependent upon a control difference between a signal level of a level-reference signal and an actual-level value of the high-frequency signal;

a compensation element that, in the event of an ideal compensation, provides a characteristic inverse to the non-linear transmission characteristic of the signal channel and generates a non-linear distorted adjustment signal;

an adjustment element integrated in the signal channel with an amplification factor that is adjustable based on the non-linear distorted adjustment signal, wherein the compensation element is adapted to be bridged and further adapted to determine each characteristic value pair, including an ordinate and abscissa value, of the characteristic of the compensation element.

8. The device of claim 7, wherein the non-linear transmission characteristic of the signal channel is determined by the non-linear transmission characteristic of the adjustment element.

9. The device of claim 7, wherein a third compensation signal is generated by a third temperature-compensation unit for compensating a temperature-dependent displacement of the transmission characteristic of the signal channel, and wherein the third compensation signal is superimposed additively on a linear scale on the adjustment signal.

10. The device of claim 7, wherein a pre-control signal is superimposed additively on the adjustment signal of the controller.

11. The device of claim 7, wherein the high-frequency signal is registered by a detection unit at the output of the signal channel.

12. The device of claim 11, wherein the detection unit is a directional coupler.

13. The device of claim 11, wherein the high-frequency signal registered by the detection unit is mixed down via a down mixer into an intermediate-frequency signal, adapted via a measurement amplifier with a variable amplification factor to the level of a digital signal-processing range of the level-control circuit, and supplied for filtering to an antialiasing low-pass filter.

14. The device of claim 13, wherein a second compensation signal is additively superimposed by a second temperature-compensation unit on the adjustment signal of the controller and the pre-control signal to compensate for a temperature dependence of the amplification factor of the measurement amplifier.

15. The device of claim 14, wherein the compensation element comprises a memory with frequency-dependent coarse ordinate values for a characteristic of the compensation element stored in individual memory cells and an interpolator for determining fine ordinate values, wherein the fine ordinate values are added to the coarse ordinate values stored in the memory.

16. The device of claim 15, wherein the frequency of the high-frequency signal and higher-value bits of an un-compensated summation-adjustment signal derived from the adjustment signal of the controller, a pre-control signal, and the second compensation signal are used to address the memory cells of the memory with the coarse ordinate value.

17. The device of claim 15, wherein the coarse ordinate value addressed in the memory, an adjacent coarse ordinate value, and lower-value bits of an un-compensated adjustment signal derived from the adjustment signal of the controller, a pre-control signal, and the second compensation signal are used in order to determine the fine ordinate value.

18. The device of claim 7, wherein the controller and a signal-limiter connected to the controller are designed in a digital manner.

19. The device of claim 7, wherein a first temperature-compensation unit generates a first compensation signal superimposed additively on the level-reference signal to compensate for temperature-dependent displacements of the transmission characteristic of the signal channel on a logarithmic scale.

20. The device of claim 7, wherein the signal channel contains a calibration line and an isolation amplifier connected to the adjustment element.

* * * * *